United States Patent [19]

Sawai

[11] Patent Number: 4,604,753
[45] Date of Patent: Aug. 5, 1986

[54] SEMICONDUCTOR LASER MODULE HAVING AN IMPROVED TEMPERATURE CONTROL ARRANGEMENT

[75] Inventor: Masaaki Sawai, Takasaki, Japan

[73] Assignee: Hitachi, Ltd., Tokyo, Japan

[21] Appl. No.: 554,959

[22] Filed: Nov. 25, 1983

[30] Foreign Application Priority Data

Nov. 24, 1982 [JP] Japan .................. 57-204645

[51] Int. Cl.⁴ .......................................... H01S 3/045
[52] U.S. Cl. .................................. 372/36; 357/17;
357/19; 357/81; 372/29; 372/38
[58] Field of Search ............ 372/36, 34, 50, 38,
372/29; 357/17, 19, 28, 81, 87

[56] References Cited

U.S. PATENT DOCUMENTS

| 4,215,577 | 8/1980 | Griffing et al. | 357/28 |
|---|---|---|---|
| 4,238,759 | 12/1980 | Hunsperger | 357/28 |
| 4,297,653 | 10/1981 | Scifres et al. | 372/50 |
| 4,338,577 | 7/1982 | Sato et al. | 372/36 |
| 4,399,541 | 8/1983 | Kovats et al. | 372/36 |

FOREIGN PATENT DOCUMENTS

| 2542174 | 7/1976 | Fed. Rep. of Germany . |
| 2737345 | 3/1978 | Fed. Rep. of Germany . |
| 2054949 | 2/1981 | United Kingdom . |
| 2097184 | 10/1982 | United Kingdom . |
| 2112565 | 7/1983 | United Kingdom . |

OTHER PUBLICATIONS

Patents Abstracts of Japan, E-158, Feb. 15, 1983; vol. 7, No. 36, No. 57-188894/1982.
Wittke et al, "Stabilization of CW Injection Lasers", RCA Technical Notes, No. 1005, Apr. 9, 1975, pp. 1-3.

Primary Examiner—James W. Davie
Attorney, Agent, or Firm—Antonelli, Terry & Wands

[57] ABSTRACT

A semiconductor laser device is provided including semiconductor laser element, a PN-junction element which is used for temperature detection, and a thermoelectric heat pump which is electrically connected to the PN-junction element. According to this arrangement, heat developing from the semiconductor laser element is sensed by exploiting the fact that the forward voltage $V_F$ of the PN-junction element or PN-junction diode changes in correspondence with the change of the ambient temperature (this phenomenon itself is a matter already known), and the change of the forward voltage $V_F$ is fed back to the thermoelectric heat pump. Therefore, even when the semiconductor laser device is placed in the condition of a very high ambient temperature (open air temperature), the semiconductor laser element is cooled down to a predetermined temperature by the thermoelectric heat pump so as to produce a prescribed optical power at all times. Thus, the semiconductor laser element itself is driven in an appropriate temperature condition (for example, 25° C.), so that the degradation of the semiconductor laser element can be prevented.

16 Claims, 10 Drawing Figures

FIG. 8

SEMICONDUCTOR LASER MODULE HAVING AN IMPROVED TEMPERATURE CONTROL ARRANGEMENT

BACKGROUND OF THE INVENTION

The present invention relates to a semiconductor laser device, and more particularly to a semiconductor laser device whose laser element has an enhanced reliability.

It is well known that a semiconductor laser is very susceptible to high temperatures brought about by the generation of heat by the semiconductor laser itself and to changes in ambient temperature, and that these factors can lead to a lowering of the optical power and a degradation in the device lifetime.

In order to solve these problems concerning temperature, a prior-art semiconductor laser device has been furnished with a heat sink (also called "submount") of good thermal conduction and/or a photosensor for monitoring the optical power, or the like. The heat sink or submount is usually made of copper. Since, however, copper is inferior in workability, silicon (Si) is well known as a substitute material from, e.g., the official gazette of Japanese Utility Model Registration Application Publication No. 54-19829. As is known from the official gazette of Japanese Utility Model Registration Application Publication No. 54-3660, utilizing a silicon chip as the submount makes it possible to form the photosensor within the submount. The number of components required to constitute the semiconductor laser device can therefore be reduced, which permits the advantages of a lower cost and a smaller size.

The aforementioned official gazette of Japanese Utility Model Registration Application Publication No. 54-3660 discloses a technique wherein the laser radiation of the semiconductor laser is received by the photosensor, and current to flow through the semiconductor laser is adjusted according to the variation of the ambient temperature, whereby the optical power of the semiconductor laser is controlled to be constant. That is, the official gazette discloses the semiconductor laser device furnished with automatic power control means. Such automatic power control means operates very effectively when the ambient temperature is near 25° C., but it is functionally limited when the ambient temperature is too high or too low. Therefore, a prescribed optical power becomes unattainable even with the automatic power control means.

As seen from the official gazette of Japanese Laid-open Patent Application No. 50-81695, there has been proposed a semiconductor laser device including, besides the photosensor, a theremoelectric heat pump which executes cooling by utilizing the Peltier effect. This semiconductor laser device disclosed in the official gazette of Japanese Laid-open Patent Application No. 50-81695 can very advantageously increase the lifetime of a semiconductor laser element in such a way that the thermoelectric heat pump is used for holding the temperature of the semiconductor laser element constant, thereby to keep the optical power constant.

With such semiconductor laser device, however, a submount is made of copper, and the photosensor is formed in a substrate which is made of a material different from that of the submount. Accordingly, the number of components which constitutes the semiconductor laser device becomes large. This results in the problem that the device cannot be made low in cost and small in size. Moreover, this device is based on automatic power control means for monitoring laser radiation with the photosensor, as is the case with to the aforementioned semiconductor laser device disclosed in the official gazette of Japanese Utility Model Registration Application Publication No. 54-3660. It is therefore limited in attaining a prescribed optical power against ambient temperatures.

SUMMARY OF THE INVENTION

In consideration of the problems described above, the inventor considered, before making the present invention, a semiconductor laser device in which a semiconductor laser element is held at a constant temperature irrespective of ambient temperatures so as to produce a prescribed optical power at all times. The semiconductor laser device is furnished with automatic temperature control means utilizing a thermistor. Concretely, the thermistor is used for controlling a theremoelectric heat pump. In particular, the thermistor is mounted in a metal capsule along with the semiconductor laser element from the viewpoint of detecting the temperature of the vicinity of the semiconductor laser element and controlling the thermoelectric heat pump accurately as far as possible. In mounting the thermistor, an epoxy type resin adhesive is used.

With such a semiconductor laser device, however, a gas develops from the resin adhesive used to mount the thermistor when a metal encapsulation is used (hermetic sealing), and it might form a factor for lowering the reliability of the semiconductor laser device. Moreover, the number of components to be assembled in the metal capsule becomes large, and the assembling job is difficult of rationalization.

In solving the problems mentioned above, the inventor has noticed; (1) that Si of good workability is used for a submount; and (2) that a PN-junction diode exhibits a temperature characteristic.

The present invention has been made on the basis of these observations, and the objects of the present invention as well as the fundamental arrangement thereof for accomplishing the objects are as stated below.

An object of the present invention is to provide a semiconductor laser device which has a high reliability irrespective of ambient temperatures.

Another object of the present invention is to provide a semiconductor laser device of high reliability which is small in size and low in cost.

Still another object of the present invention is to provide a high power semiconductor laser device which has a high reliability.

The fundamental arrangement of the present invention for accomplishing the aforementioned objects comprises a semiconductor laser element, a PN-junction element which is used for temperature detection, and a thermoelectric heat pump which is electrically connected to the PN-junction element.

According to this arrangement of the present invention, heat developing from the semiconductor laser element is sensed by exploiting the fact that the forward voltage $V_F$ of the PN-junction element or PN-junction diode changes in correspondence with the change of the ambient temperature (this phenomenon itself is a matter already known), and the change of the forward voltage $V_F$ is fed back to the theremoelectric heat pump. Therefore, even when the semiconductor laser device is placed in the condition of a very high ambient temperature (open air temperature), the semiconductor laser element is cooled down to a predetermined temperature by the thermoelectric heat pump so as to produce a prescribed optical power at all times. Thus, according to the semiconductor laser device of the present invention, even in the condition of the high ambient temperature (for example, 70° C.), the semiconductor laser element itself is driven in an appropriate temperature condition (for example, 25° C.), so that the degradation of the semiconductor laser element can be prevented. Moreover, the PN-junction element itself can be assembled in a submount for which a semiconductor material of good workability is used, or in a semiconductor substrate itself which constitutes the semiconductor laser element, so that a small-sized inexpensive device is provided.

DESCRIPTION OF THE PREFERRED EMBODIMENTS

Figure 1:
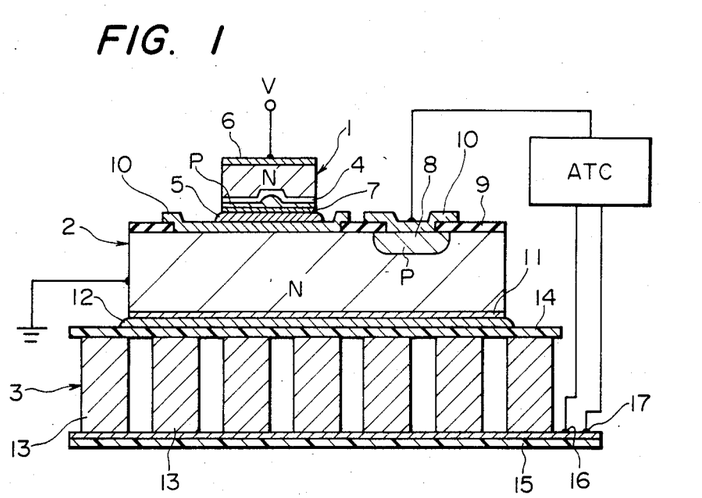
FIG. 1 is a model sectional view of a semiconductor laser device showing an embodiment of the present invention.

FIG. 1 illustrates a semiconductor laser device showing one embodiment of the present invention in model-like fashion. This semiconductor laser device is so constructed that a semiconductor laser element 1, a submount 2 made of a silicon chip, and a thermoelectric heat pump 3 are stacked. The semiconductor laser element 1 is an infrared laser of the well-known GaAs-AlGaAs double heterostructure type, and an active layer 4 thereof is attached to the submount 2 by a brazing material, e.g., Pb-Sn solder 5 so as to be proximate to the submount 2. Electrodes 6 and 7 made of Au (gold) are respectively formed on the upper and lower surfaces of the semiconductor laser element 1. The submount 2 is used for improving the heat radiation of the semiconductor laser element 1, and it is made of the silicon chip, namely, a semiconductor material. Concretely, this submount 2 is made of an N-type silicon substrate. A P-type region 8 is formed in the submount 2 by a known selective diffusion, process and the N-type silicon substrate (2) and the P-type region 8 constitute a PN-junction diode for temperature detection. Further, a silicon oxide film ($SiO_2$ film) 9 and electrodes 10 made of Au are formed on the front surface of the submount 2, and an electrode 11 made of Au is formed on the whole rear surface of the submount 2. This submount 2 is attached to the thermoelectric heat pump 3 by a brazing material (Pb-Sn solder) 12. The thermoelectric heat pump 3 functions to cool the semiconductor laser element 1 through the submount 2. It is constructed of a pluraity of thermo-module panels 13, ceramic plates 14 and 15 which hold the thermo-module panels therebetween, and a plus terminal 16 and a minus terminal 17 which are disposed on the ceramic plate 15. The PN-junction diode is connected to an automatic temperature control circuit ATC, which is connected with the terminals 16 and 17 of the thermoelectric heat pump 3 and which operates so that the front surface of the ceramic plate 14 of the thermoelectric heat pump 3 may be cooled down to a predetermined temperature. Practical examples of the automatic temperature control circuit ATC will be described in detail later.

According to the semiconductor laser device thus far described, when current not lower than a threshold current is caused to flow through the semiconductor laser element 1 via a voltage source V, lasing takes place, and laser radiation is emitted from two cleaved planes or reflective faces at both the ends of the active layer 4. At this time, the semiconductor laser element 1 generates heat, which is transmitted to the submount 2. In consequence, the PN-junction diode disposed in the submount 2 has its forward voltage $V_F$ changed by the temperature of the submount 2 itself. The forward voltage $V_F$ is sensed by the automatic temperature control circuit ATC, from which a current corresponding to the forward voltage $V_F$ is outputted. The thermoelectric heat pump 3 is driven by the output current so that the semiconductor laser element 1 operate in an optimum temperature condition.

Figure 2:
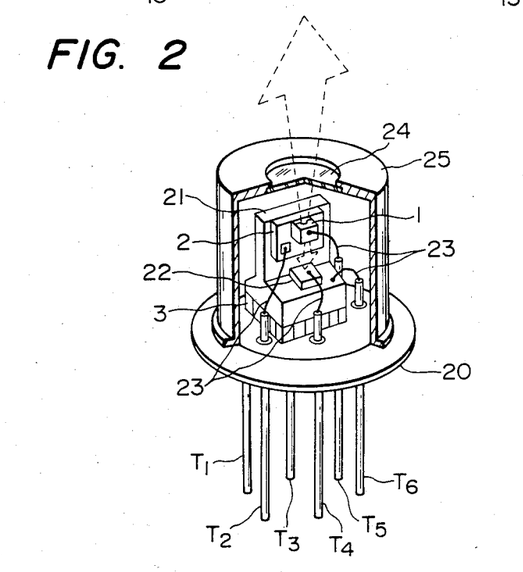
FIG. 2 is a perspective view of the exterior structure of a semiconductor laser device showing an embodiment of the present invention.

FIG. 2 concretely illustrates the external appearance and internal structure of the semiconductor laser device in the present invention. As shown in FIG. 2, the thermoelectric heat pump 3 is fastened on a stem 20 provided with a plurality of external terminals $T_1$-$T_6$, and a metal support plate 21 for heat radiation is fastened on the thermoelectric heat pump 3. In addition, the submount 2 as shown in FIG. 1 is fastened on the metal support plate 21. Further fastened on the metal support plate 21 is an optical output sensor 22 for monitoring optical output power. One example of this is one disclosed in the official gazette of Japanese Laid-open Patent Application No. 50-81695 referred to before. The semiconductor laser element 1 as shown in FIG. 1 is fastened on the submount 2. The electrodes disposed on the submount 2, semiconductor laser element 1 and optical output sensor 22 are electrically connected to the external terminals $T_2$, $T_5$ and $T_4$ by wires (Au wires) 23, respectively. These constituent parts of the semiconductor laser device and hermetically sealed by a metal cap 25 which is provided with a glass window 24. In such a semiconductor laser device, the laser beams of the semiconductor laser element 1 are projected as indicated by arrows of dotted lines.

Figure 3:
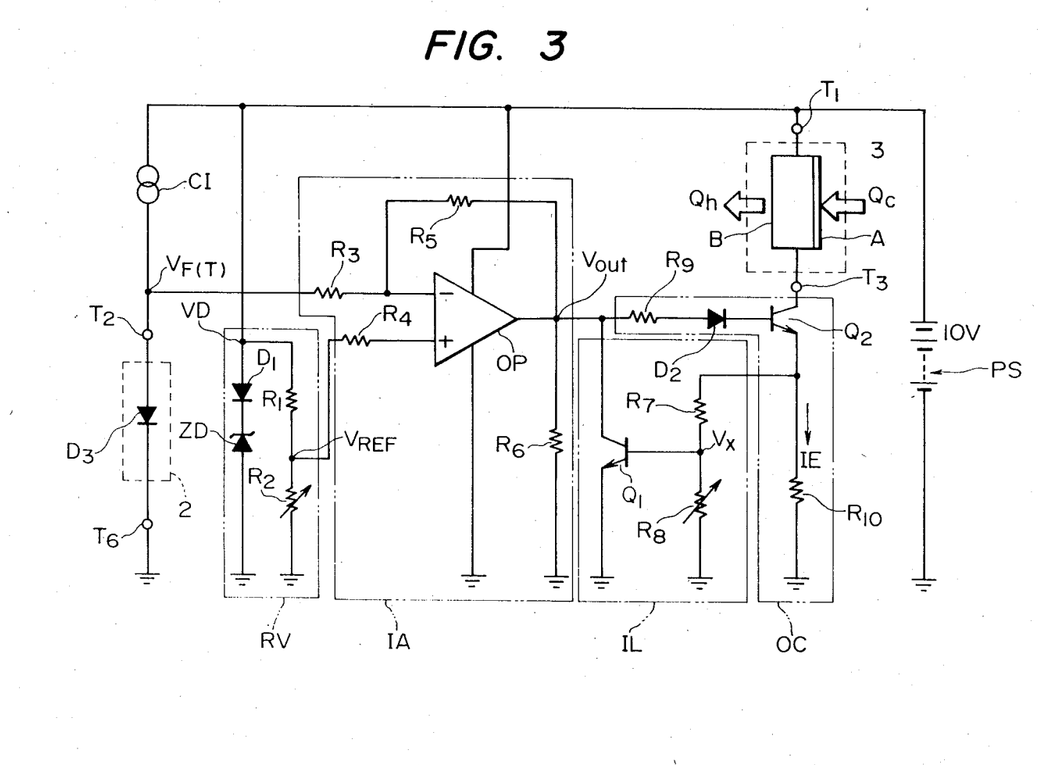
FIG. 3 is a diagram of an automatic temperature control circuit which is applied to the semiconductor laser device of the present invention.

FIG. 3 shows a practical example of the arrangement of the automatic temperature control circuit ATC. The automatic temperature control circuit shown in FIG. 3 is effective especially for the semiconductor laser device to be used in a place where the ambient temperature is at least 25° C. (the optimum temperature). It is constructed of a constant current source CI, a reference voltage generator circuit RV, an inverted amplifier circuit IA, a current limiter IL, an output circuit OC and a power source PS. In the reference voltage generator circuit RV, a Zener diode ZD for a reference voltage and a diode $D_1$ for temperature compensation of the Zener diode ZD are connected in series. Further, a resistor (10 kΩ) $R_1$ and a variable resistor (set at 1 kΩ in the present embodiment) $R_2$ are connected in series across the series connected diodes. The variable resistor $R_2$ serves to produce the desired reference voltage $V_{REF}$. In the inverted amplifier circuit IA, an input resistor (10 kΩ) $R_3$ connected to the constant current source CI and an input resistor (10 kΩ) $R_4$ connected to the output terminal ($V_{REF}$) of the reference voltage generator circuit RV are respectively connected to the input ends of an operational amplifier OP. A feedback resistor of high resistance (1MΩ) $R_5$ is connected between the minus side input end and output end of the operational amplifier OP, while a resistor (1 kΩ) $R_6$ is connected between the output end and ground end thereof. In the current limiter IL, an NPN transistor $Q_1$ of $h_{FE(min)}=100$ has its collector connected to the output end of the operational amplifier OP and its emitter grounded. A voltage divided by a resistor (100 Ω) $R_7$ and a variable resistor (set at 1 kΩ in the present embodiment) $R_8$ is applied to the base of the transistor $Q_1$. This current limiter is disposed for preventing the flow of an excess current to a transistor $Q_2$ in the output circuit OC, in other words, to the thermoelectric heat pump 3. In the output circuit OC, a resistor (1 kΩ) $R_9$ and a level shifting diode $D_2$ are connected in series, and the diode $D_2$ is connected to the base of the transistor $Q_2$ of $h_{FE(min)}=500$. Concretely, this transistor $Q_2$ is a transistor for high gain amplification; for example; an NPN Darlington transistor. The PN-junction diode $D_3$ for temperature compensation formed in the submount 2, and the thermoelectric heat pump 3 are connected as shown in FIG. 3 to the automatic temperature control circuit ATC. Terminals $T_2$, $T_6$, $T_1$ and $T_3$ correspond to the external terminals shown in FIG. 2, respectively.

Now, the operation of the automatic temperature control circuit ATC will be described.

The reference voltage $V_{REF}$ in the reference voltage generator circuit RV is expressed by Equation (1):

$$V_{REF} = V_D \times \frac{R_2}{R_1 + R_2} \quad (1)$$

In Equation (1), $V_D$ denotes the sum between the forward voltage $V_F$ of the diode $D_1$ and the Zener voltage $V_z$ of the Zener diode ZD. Here, when $V_F=0.7$ V and $V_z=7$ V are assumed, $V_D=7.7$ V holds.

Accordingly, the reference voltage $V_{REF}$ becomes 0.7 V.

On the other hand, voltage relations in the inverted amplifier circuit IA are expressed by Equations (2) and (3):

$$V_{F(T)} + R_3 \cdot \frac{V_{out} - V_{F(T)}}{R_3 + R_5} = V_{REF} \quad (2)$$

$$\frac{R_3}{R_3 + R_5} \cdot V_{out} + \frac{R_5}{R_3 + R_5} \cdot V_{F(T)} = V_{REF} \quad (3)$$

In Equations (2) and (3), $V_{F(T)}$ denotes the forward voltage of the diode $D_3$, and $V_{out}$ the output voltage of the inverted amplifier circuit IA, namely, that of the operational amplifier OP.

The output voltage $V_{out}$ is accordingly expressed by the following equation (4):

$$V_{out} = \frac{R_3 + R_5}{R_3} \cdot V_{REF} - \frac{R_5}{R_3} \cdot V_{F(T)} \quad (4)$$

Further, the output voltage $V_{out}$ is in the relation of Equation (5) in the output circuit OC:

$$V_{out} = R_{10} \cdot I_E + V_{F(2)} + V_{BE} + \frac{R_9}{h_{FE2}} \cdot I_E \quad (5)$$

In Equation (5), $I_E$ denotes the emitter current of the transistor $Q_2$, $V_{F(2)}$ the forward voltage of the diode $D_2$, $V_{BE}$ the base-emitter voltage of the transistor $Q_2$, and $h_{FE2}$ the current gain of the transistor $Q_2$.

From Equation (5), the emitter current $I_E$ is expressed by Equation (6):

$$I_E = \frac{\{V_{out} - (V_{F(2)} + V_{BE})\} \cdot h_{FE2}}{h_{FE2} \cdot R_{10} + R_9} \quad (6)$$

In case of using a silicon diode, the change of the forward voltage $V_F$ due to temperature rise is about $-2$ mV/°C.

Accordingly, when the ambient temperature is high, the forward voltage $V_{F(T)}$ of the diode $D_3$ becomes low. For this reason, the output voltage $V_{out}$ becomes high in accordance with Equation (4). When this output voltage $V_{out}$ becomes high, the emitter current $I_E$ increases according to the relation of Equation (6). As a result, cooling $Q_c$ arises at the plane A of the thermoelectric heat pump 3, and heating arises at the plane B thereof. Since the submount 2 is installed on the plane A, it is cooled by the thermoelectric heat pump 3.

The current limiter IL operates in order to prevent excess currents to the thermoelectric heat pump 3 and the transistor $Q_2$.

A requisite for the operation of the current limiter IL is to hold the relation of Equation (7):

$$V_x = R_{10} \cdot I_E \frac{R_8}{R_7 + R_8} \geqq V_{BE1} \quad (7)$$

In Equation (7), $V_x$ denotes the voltage of the node of the resistors $R_7$ and $R_8$, and $V_{BE1}$ the base-emitter voltage of the transistor $Q_1$.

From Equation (7), the emitter current $I_E$ is expressed by Equation (8):

$$I_E \geqq V_{BE1} \cdot \frac{R_7 + R_8}{R_8 \cdot R_{10}} \quad (8)$$

Here, $V_{BE1} \approx 0.6$ V. Therefore, when the foregoing resistances of the resistors $R_7$, $R_8$ and $R_{10}$ are substituted, the emitter current can be suppressed to $I_E=400$ mA.

In accordance with the embodiment of the present invention described above, the objects can be accomplished for the reasons stated below.

Figure 4A:
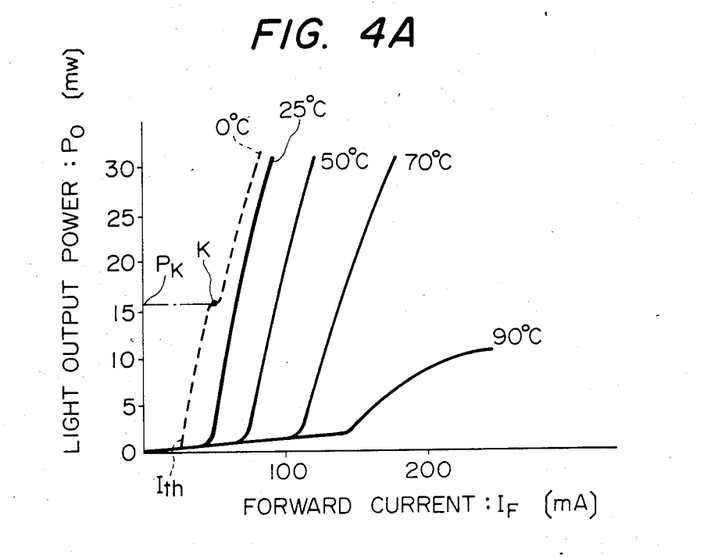
FIG. 4A is a graph showing the forward current-optical output power characteristic of a semiconductor laser element.

FIG. 4A shows the forward current-optical output power characteristics of a semiconductor laser element. As is apparent from the figure, the output of the semiconductor laser element depends upon temperatures, and when the ambient temperature becomes high, the optical output power $P_o$ lowers. In order to raise the optical output power in case of a high ambient temperature (e.g. 50° C., 70° C. or 90° C.), a considerable amount of forward current must be caused to flow. By way of example, with the intention of producing 20 mW as the optical output power $P_o$, a forward current $I_F$ of 70 mA may be caused to flow when the ambient temperature $T_a$ is 25° C. However, 110 mA must be caused to flow as $I_F$ at $T_a=70°$ C., and it becomes impossible at $T_a=90°$ C. to produce the optical output power of 20 mW. At high ambient temperatures, accordingly, to semiconductor laser element is liable to degrade. Moreover, it becomes impossible to attain a satisfactory optical output. Further, as the ambient temperature becomes high, the slope efficiency $\Delta P_o/\Delta I_F$ decreases. That is, the $P_o$ variation becomes small relative to the $I_F$ variation. This renders it difficult to use the semiconductor laser device for a laser beam printer or for a disk memory requiring a still higher output.

According to the present embodiment, the temperature dependency of the semiconductor laser element as stated above has been improved, and it is possible to attain an optimum optical output and to prevent the degradation of the laser element. More specifically, in the case of the high ambient temperature, the thermoelectric heat pump is cooled down to an appropriate temperature by the foregoing automatic temperature control circuit ATC. For example, even when the ambient temperature (open air temperature) is 50° C., the semiconductor laser element can be held at a temperature of 25° C. Therefore, the forward current need not be increased, and the degradation of the element can be prevented. Thus, a semiconductor laser device having a high reliability is provided.

According to the present embodiment, the PN-junction diode to be used for temperature detection is formed in the submount as shown in FIG 1. Accordingly, when compared with the semiconductor laser device employing a thermistor which was considered before making the present invention, the present embodiment has the advantage that the number of assembly parts is reduced. Therefore, a semiconductor laser device can be provided which is small in size and relatively inexpensive. In addition, a more precise temperature control can be effected.

According to the present embodiment, a high optical output can be produced even in the case of a high ambient temperature. More specifically, the range of the maximum optical outputs is limited merely with the automatic optical power control hitherto considered, but it can be expanded by disposing the automatic temperature control means. Therefore, the range of usage widens.

According to the embodiment, the automatic temperature control circuit ATC is effective in the case of a high ambient temperature. More specifically, as explained with reference to FIG. 3, current is caused to flow through the thermoelectric heat pump 3 in only one direction, and the submount 2 is installed on the cooling plane A of the thermoelectric heat pump 3. Accordingly, the thermoelectric heat pump 3 executes only cooling for the submount 2, so that the automatic temperature control circuit ATC demonstrates its effect in the case of a high ambient temperature.

As illustrated in FIG. 3, the plane opposite to the cooling plane A acts as the heating plane B in the thermoelectric heat pump 3 which utilizes the Peltier effect. Accordingly, when the direction of current is reversed, the cooling plane A turns into a heating plane. An automatic temperature control circuit to be described below is such that the sense of current to flow through the thermoelectric heat pump 3 is changed so as to permit this thermoelectric heat pump 3 to be used as a heating element when the ambient temperature is low.

Figure 5:
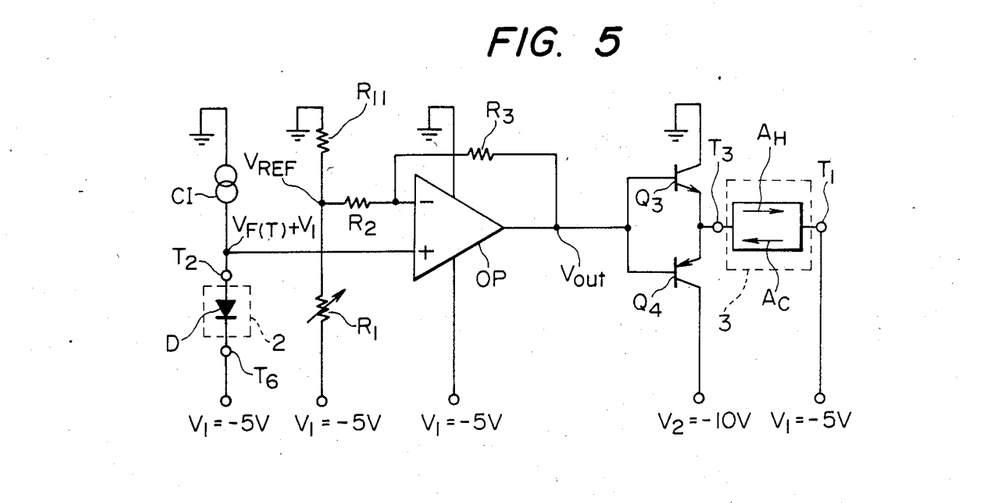
FIG. 5 is a diagram of another automatic temperature control circuit which is applied to the semiconductor laser device of the present invention.

FIG. 5 schematically shows the automatic temperature control circuit which is applicable even in case of a low ambient temperature. Basically, the control circuit employs a push-pull circuit which can cause bidirectional currents to flow through the thermoelectric heat pump. In FIG. 5, parts of the same designations as in FIG. 3 are denoted by the same symbols or numerals.

According to the automatic temperature control circuit shown in FIG. 5, an NPN transistor $Q_3$ and a PNP transistor $Q_4$ perform the push-pull operation, whereby bidirectional currents as indicated by arrows are caused to flow through the thermoelectric heat pump 3.

Referring to FIG. 5, the output voltage $V_{out}$ is expressed by Equation (9):

$$V_{out} = \frac{R_2 + R_3}{R_2} \cdot \{V_1 + V_{F(T)}\} - \frac{R_3}{R_2} \cdot V_{REF} \qquad (9)$$

When $R_2=100\Omega$ and $R_3=12$ k$\Omega$ are assumed in Equation (9), the reference voltage $V_{REF}$ is set as described below, in order to operate the semiconductor laser element in the condition of 25° C. (the optimum ambient temperature). The forward voltage $V_F$ of the PN-junction diode D at the ambient temperature of 25° C. is about 0.6 V. Meanwhile, when the ambient temperature is 25° C., the thermoelectric heat pump 3 need not be operated. To the end of preventing the thermoelectric heat pump 3 from operating, the base-emitter voltage of each of the transistors $Q_3$ and $Q_4$ may fail to become at least 0.6 V. According to the embodiment, since $V_1=-5$ V is set, the transistors $Q_3$ and $Q_4$ do not operate when $V_{out}=-5$ V is established. Accordingly, the value of the reference voltage $V_{REF}$ to establish $V_{out}=-5$ V is obtained from Equation (9). That is, the resistance of the variable resistor $R_1$ may be determined so that the reference voltage may become $V_{REF}=-4.395$ V.

According to the semiconductor laser device furnished with such an automatic temperature control circuit, when it is used at an ambient temperature below 25° C., the forward voltage $V_{F(T)}$ of the PN-junction diode D used for temperature detection rises above 0.6 V. Accordingly, the output voltage $V_{out}$ becomes $-5$ V or less in accordance with Equation (9). As a result, the transistor $Q_3$ turns ON, and current flows in the direction of arrow $A_H$ (heating for the submount). In contrast, in use at an ambient temperature of or above 25° C., the forward voltage $V_{F(T)}$ of the PN-junction diode D becomes lower than 0.6 V. Accordingly, the output voltage $V_{out}$ becomes $-5$ V or more in accordance with Equation (9). As a result, the transistor $Q_4$ turns ON, and current in the direction of arrow $A_C$ (cooling for the submount) flows.

When the automatic temperature control circuit of FIG. 5 thus far described is applied, an effect to be stated below is especially brought forth.

A curve indicated by a dotted line in FIG. 4A is an $I_F$-$P_o$ characteristic curve at a low temperature of 0° C. As is apparent from the figure, a current value required to produce a laser beam (induced emission radiation)

Figure 4B:
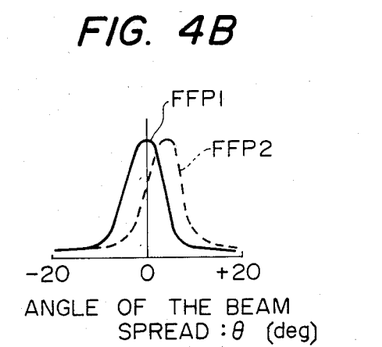
FIG. 4B is a graph showing the far field pattern of the semiconductor laser element.
Figure 4C:
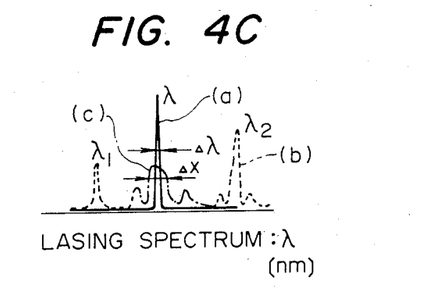
FIG. 4C is a graph showing the lasing spectrum of the semiconductor laser element.

(the current value at this time is called the "threshold current value $I_{th}$") is small. As the forward current $I_F$ is further increased, the optical laser output $P_o$ enlarges gradually. In some cases, however, the linearity of the optical output collapses relatively quickly. The corresponding point K is termed a "Kink", and the optical output at this point is the "Kink level ($P_K$)". The Kink is liable to occur particularly at low temperatures. This Kink signifies the abnormalities of the transverse mode and longitudinal mode of the laser beam. By way of example, in a transverse mode change, a deviation arises in the far field pattern as shown in FIG. 4B. That is, a pattern FFP1 deviates into a pattern FFP2. For this reason, particularly in a semiconductor laser device wherein a fiber is coupled to a semiconductor laser element so as to transmit laser radiation therewith, the photocoupling efficiency becomes unstable to cause, for example, a second-order harmonic distortion. In addition, in a longitudinal mode change, an abnormality is noted in the lasing spectrum as shown in FIG. 4C. That is, as illustrated in FIG. 4C, an abnormality such as a spectrum (b) or (c) develops with regard to a normal spectrum (a). As a result, the noise figure (signal-to-noise ratio) degrades, or the transmission characteristic worsens. Accordingly, the Kink level ($P_K$) becomes the maximum output in the practical use of the semiconductor laser element.

However, according to the semiconductor laser device furnished with the automatic temperature control means shown in FIG. 5 (another embodiment of the present invention), even when the ambient temperature is low, the semiconductor laser element is brought to the optimum temperature by the thermoelectric heat pump, and hence, the foregoing Kink is less likely to occur. For this reason, even when the semiconductor laser device is used under low temperature conditions, the abnormalities of the transverse mode and the longitudinal mode do not arise. Therefore, the photocoupling efficiency as referred to above does not lower, and a high output is obtained. Needless to say, this embodiment achieves the effects attained by the preceding embodiment.

Figure 6:
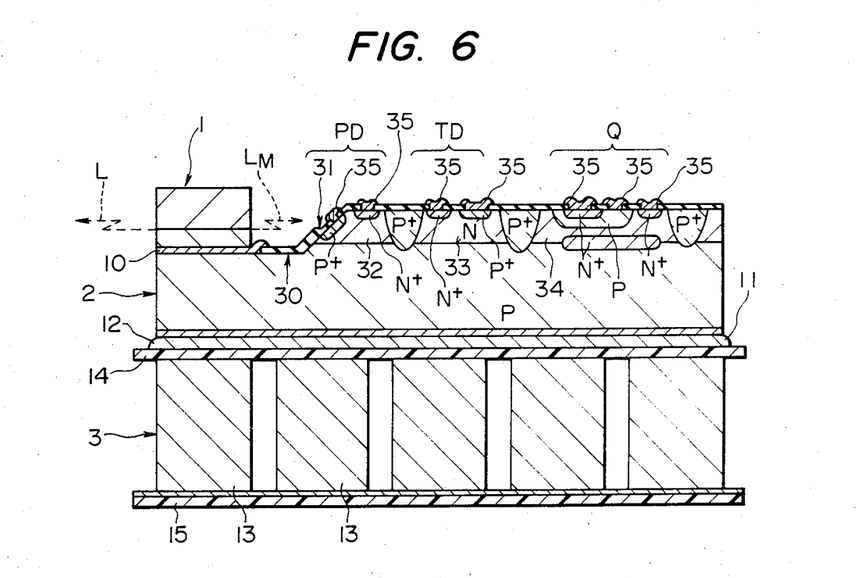
FIG. 6 is a model sectional view of a semiconductor laser device showing another embodiment of the present invention.

FIG. 6 shows still another embodiment of the present invention.

Figure 7:
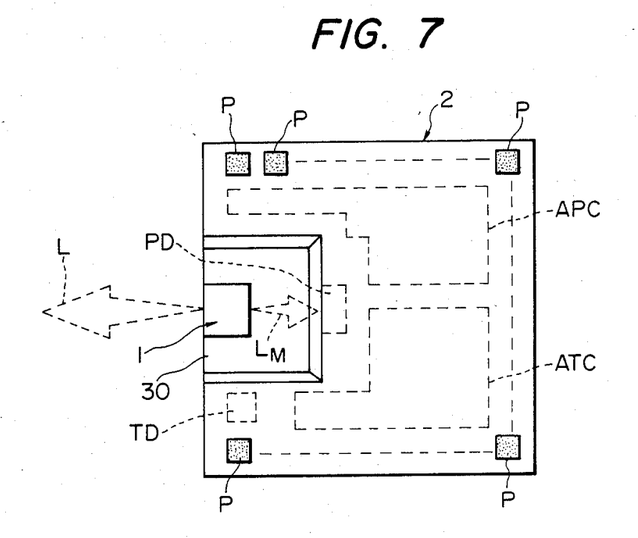
FIG. 7 is a plan view of a submount which is pertinent to the present invention.

In the foregoing embodiments, the semiconductor element built in the submount has been confined to the PN-junction diode to be used for temperature detection. In contrast, the embodiment to be described below with reference to FIG. 6 is such that the automatic temperature control circuit shown in FIG. 3 or FIG. 5 is built in the submount. In FIG. 6, parts of the same designations as in FIG. 3 are assigned the same symbols or numerals. The semiconductor laser device shown in FIG. 6 is constructed of a semiconductor laser element 1; a submount 2 in which an optical power sensor (PN-junction diode) PD, a PN-junction diode TD for temperature detection and a semiconductor element (transistor) Q constituting a part of the automatic temperature control circuit are built; and a thermoelectric heat pump 3. The semiconductor laser element 1 has, for example, the structure as shown in FIG. 1 and emits laser beams L and $L_M$ from both its end faces. The submount 2 is made of, for example, silicon as in the foregoing embodiments, and it is formed near an end part thereof with recess 30, in which the semiconductor laser element 1 is mounted. In the slant face 31 of the recess 30, the optical power sensor PD is formed, which can reliably sense the laser beam $L_M$ emitted from the semiconductor laser element 1. The optical power sensor PD, PN-junction diode TD and transistor Q are formed in N-type epitaxial layers 32, 33 and 34 isolated from one another, by the ordinary selective diffusion. Electrodes 35 for these components are made of a metal, for example, aluminum. On the other hand, an electrode 10 on the front surface of the submount 2 on which the semiconductor laser element 1 is installed is made of a noble metal, for example, gold as stated before. Further, the submount 2 is installed on the thermoelectric heat pump 3. The PN-junction diode TD for temperature detection should preferably avoid the influence of the laser beam $L_M$ to the utmost. This PN-junction diode TD is accordingly formed in a position deviating from a laser beam axis $L_{MX}$ as illustrated in FIG. 7. In contrast, the optical power sensor PD is located and formed on the laser beam axis $L_{MX}$ for the purpose of reliably sensing the laser beam $L_M$. Referring to FIG. 7, the automatic temperature control circuit ATC which can be of the type shown in FIG. 3 or FIG. 5, is electrically connected with the PN-junction diode TD. On the other hand, an automatic optical power control circuit APC is electrically connected with the optical power sensor PD. Both of the control circuits ATC and APC can be partially or completely built in the submount 2, namely, a silicon semiconductor body. In addition, bonding pads P made of, e.g., aluminum are formed on the submount 2 so as to lie along the peripheral edge thereof. Fine wires made of, e.g., gold are bonded to the bonding pads P, which are electrically connected with external terminals by the fine wires.

According to the embodiment of FIGS. 6 and 7, the temperature and power control circuits are preferably both built in the submount 2, so that the number of components to be externally attached becomes very small. Thus, communication equipment or audio equipment which employs the semiconductor laser device as in the present embodiment becomes very compact, and this can reduce cost and provide high reliability. On the other hand, if desired, the control circuits ATC and APC can be built in separate semiconductor bodies rather than in a common semiconductor According to the present invention, the following modifications are further considered:

(M1) The PN-junction element to be used for temperature detection can readily be built in a compound semiconductor body which consititutes the semiconductor laser element 1. In this case, the submount is not restricted to Si, and, in its place, a metal of good thermal conduction such as copper can be used. With this metal, however, the problem of workability remains as stated in the official gazette of Japanese Utility Model Registration Application Publication No. 54-19829.

(M2) In the embodiments shown in FIG. 1 and FIG. 6, the submount can be made of Ge or GAInAsP/InP (compound semiconductor). These materials Ge and GaInAsP/InP are higher than Si in terms of quantum efficiency in a longer wavelenth region (1.2 $\mu$m–1.6 $\mu$m). Accordingly, especially in a case where the optical power sensor for receiving the laser beam is built in the submount 2 as shown in FIG. 6, a longer wavelength semiconductor laser device of high reliability is provided.

(M3) While the thermoelectric heat pump 3 is disposed in a metal capsule as illustrated in FIG. 2, it is difficult to attain a high mounting precision of the thermoelectric heat pump 3. Accordingly, it is also allowed to mount the thermoelectric heat pump 3 on the rear surface of the stem 20, in other words, outside the metal capsule, and to mount the metal support member 21 on the stem 20. Another possibility is to dispense with the metal support member 21 and mount the submount 2 on the stem 20.

Figure 8:
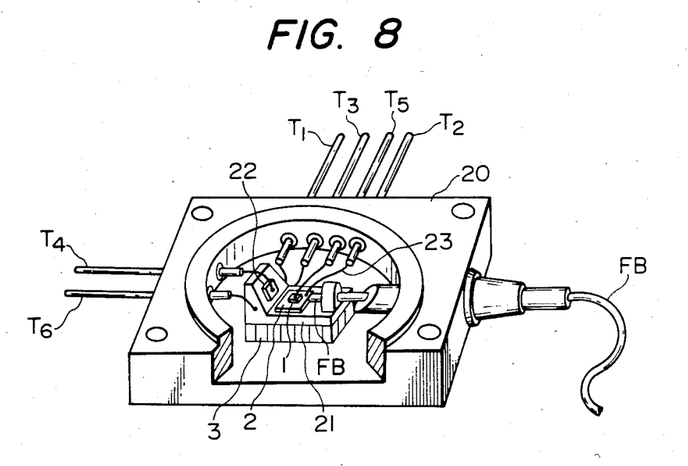
FIG. 8 is a perspective view of the exterior structure of a semiconductor laser device showing another embodiment of the present invention.

(M4) In the case of a semiconductor laser device having a fiber, a structure shown in FIG. 8 is considered instead of the package structure in FIG. 2. The semiconductor laser device illustrated in FIG. 8 is effective particularly for infrared radiation or longer wavelengths, and it is assembled in communication equipment. In FIG. 8, symbol FB indicates the fiber aligned to receive the laser output of the laser 1. The other symbols or numerals correspond to the same symbols or numerals as in FIG. 2.

The present invention thus far described is very effective for a laser beam printer or a disk memory of which a high optical output and a high reliability are especially required.

It is to be understood that the above-described arrangements are simply illustrative of the application of the principles of this invention. Numerous other arrangements may be readily devised by those skilled in the art which embody the principles of the invention and fall within its spirit and scope.

What is claimed is:

1. A semiconductor laser module comprising:
a semiconductor laser element;
a semiconductor submount of a first conductivity type which supports said semiconductor laser element;
a semiconductor region of a second conductivity type opposite to said frist conductivity type formed in said submount and located adjacent to said laser element so as to form a PN-junction element for detecting heat developing from said laser element and an ambient temperature in the area of said laser element; and
a thermoelectric heat pump which is electrically connected to said PN-junction element and which is coupled to said laser element to control the temperature of said laser element in accordance with an output signal from said PN-junction element.

2. A semiconductor laser module as defined in claim 1, wherein said submount is made of a compound semiconductor.

3. A semiconductor laser module as defined in claim 1, further comprising a temperature control circuit coupled between said PN-junction element and said heat pump, said temperature control circuit including means for monitoring the forward voltage of said PN-junction element to detect the temperature at said PN-junction element.

4. A semiconductor laser module as defined in claim 3, wherein said temperature control circuit includes means for operating said heat pump when the temperature of said PN-junction element increases above a predetermined level to cool said laser element.

5. A semiconductor laser module as defined in claim 3, wherein said temperature control circuit includes means for operating said heat pump when the temperature of said PN-junction element decreases below a predetermined level to heat said laser element.

6. A semiconductor laser module as defined in claim 4, wherein said temperature control circuit includes means for operating said heat pump when the temperature of said PN-junction element decreases below a predetermined level to heat said laser element.

7. A semiconductor laser module as defined in claim 1, wherein a metal support is interposed between said heat pump and said submount.

8. A semiconductor laser module as defined in claim 3, wherein said temperature control circuit produces an output signal to maintain the temperature of said laser element between 25° C. and 50° C.

9. A semiconductor laser module comprising:
a semiconductor laser element;
a semiconductor body including a first conductivity type region, which supports said semiconductor laser element;
a semiconductor region of a second conductivity type opposite to said first conductivity type formed in said first conductivity type region so as to form a PN-junction element for detecting heat developing from said laser element and an ambient temperature in the area of said laser element;
a photosensor located adjacent to said laser element for monitoring an optical output power of said semiconductor laser element; and
a thermoelectric heat pump which is electrically connected to said PN-junction element and which is coupled to said laser element to control the temperature of said laser element in accordance with an output signal from said PN-junction element.

10. A semiconductor laser module as defined in claim 9, wherein said PN-junction element and said photosensor are respectively formed in individual semiconductor bodies.

11. A semiconductor laser module as defined in claim 9, wherein said PN-junction element and said photosensor are respectively formed in said semiconductor body, on which said semiconductor laser element is mounted.

12. A semiconductor laser module as defined in claim 11, wherein said photosensor is located on a laser beam axis of said semiconductor laser element, and said PN-junction element is located off said laser beam axis.

13. A semiconductor laser module as defined in claim 9, further comprising a temperature control circuit coupled between said PN-junction element and said heat pump, said temperature control circuit including means for monitoring the forward voltage of said PN-junction element to detect the temperature at said PN-junction element.

14. A semiconductor laser module as defined in claim 13, wherein said temperature control circuit includes means for operating said heat pump when the temperature of said PN-junction element increases above a predetermined level to cool said laser element.

15. A semiconductor laser module as defined in claim 13, wherein said temperature control circuit includes means for operating said heat pump when the temperature of said PN-junction element decreases below a predetermined level to heat said laser element.

16. A semiconductor laser module as defined in claim 14, wherein said temperature control circuit includes means for operating said heat pump when the temperature of said PN-junction element decreases below a predetermined level to heat said laser element.

* * * * *